United States Patent
Arisawa et al.

(10) Patent No.: US 7,636,910 B2
(45) Date of Patent: Dec. 22, 2009

(54) PHOTOMASK QUALITY ESTIMATION SYSTEM AND METHOD FOR USE IN MANUFACTURING OF SEMICONDUCTOR DEVICE, AND METHOD FOR MANUFACTURING THE SEMICONDUCTOR DEVICE

(75) Inventors: Yukiyasu Arisawa, Tokyo (JP);
Tadahito Fujisawa, Yokkaichi (JP);
Shoji Mimotogi, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 373 days.

(21) Appl. No.: 11/475,075

(22) Filed: Jun. 27, 2006

(65) Prior Publication Data

US 2007/0005280 A1 Jan. 4, 2007

(30) Foreign Application Priority Data

Jun. 28, 2005 (JP) ............................. 2005-188678

(51) Int. Cl.
*G06F 17/50* (2006.01)
(52) U.S. Cl. ............................. 716/21; 716/19; 716/20; 430/5; 430/30
(58) Field of Classification Search ............. 716/19–21; 430/5, 30
See application file for complete search history.

(56) References Cited

U.S. PATENT DOCUMENTS

| | | | |
|---|---|---|---|
| 5,558,963 A | 9/1996 | Tsudaka et al. | |
| 6,208,469 B1 * | 3/2001 | Matsuura | 359/637 |
| 6,649,310 B2 * | 11/2003 | Itoh et al. | 430/5 |
| 7,090,949 B2 * | 8/2006 | Nojima et al. | 430/5 |
| 7,229,721 B2 * | 6/2007 | Mimotogi et al. | 430/5 |
| 2004/0137340 A1 | 7/2004 | Mimotogi et al. | |

FOREIGN PATENT DOCUMENTS

JP 2002-72440 3/2002

* cited by examiner

*Primary Examiner*—Thuan Do
*Assistant Examiner*—Nghia M Doan
(74) *Attorney, Agent, or Firm*—Finnegan, Henderson, Farabow, Garrett & Dunner

(57) ABSTRACT

A photomask quality estimation system comprises a measuring unit, a latitude computation unit and an estimation unit. The measuring unit measures the mask characteristic of each of a plurality of chip patterns formed on a mask substrate. The latitude computation unit computes the exposure latitude of each chip pattern based on the mask characteristic. The estimation unit estimates the quality of each chip pattern based on the exposure latitude.

13 Claims, 10 Drawing Sheets

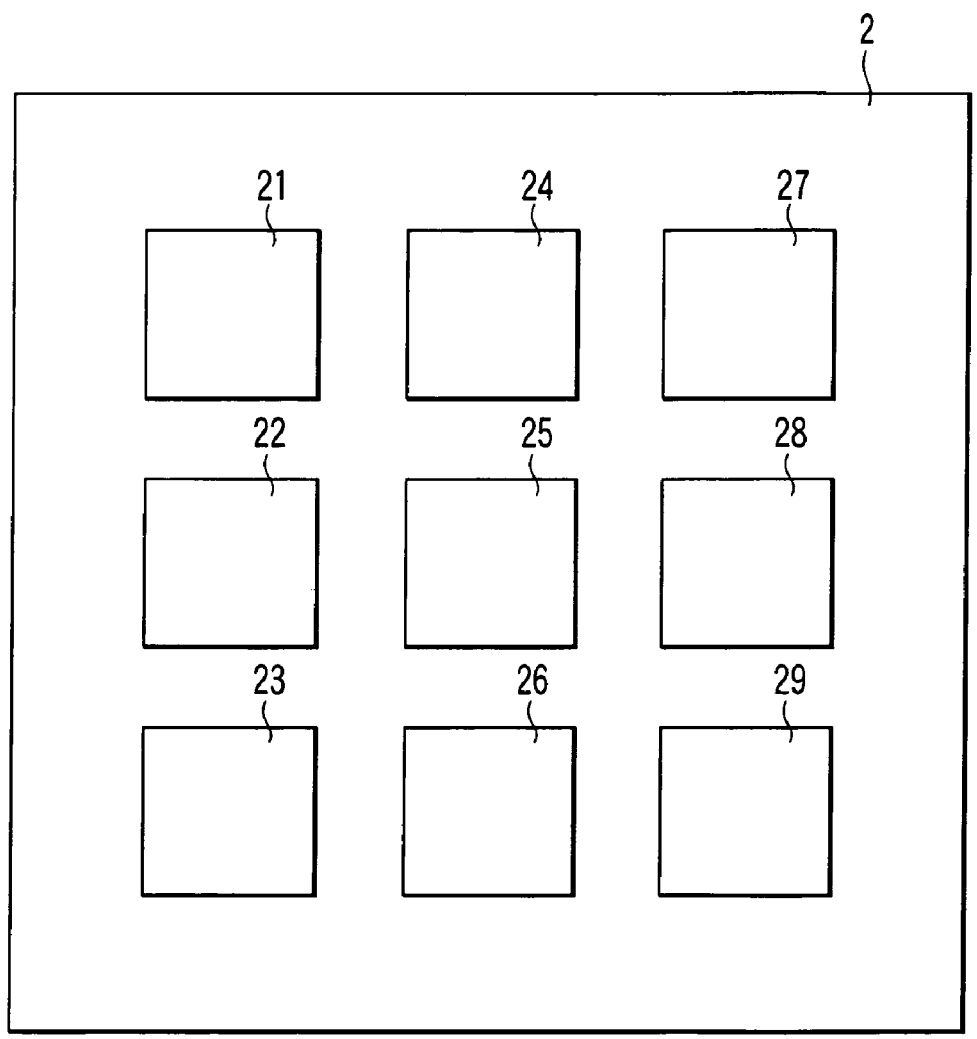
F I G. 3

FIG. 5

Entire surface

|  | Standard deviation |
|---|---|
| CD [nm] | 2.8 |
| Phase difference [deg] | 1.8 |
| Transmittance [%] | 0.11 |

FIG. 6

Chip pattern 21

|  | Standard deviation |
|---|---|
| CD [nm] | 2.1 |
| Phase difference [deg] | 1.5 |
| Transmittance [%] | 0.09 |

FIG. 7

Chip pattern 22

|  | Standard deviation |
|---|---|
| CD [nm] | 2 |
| Phase difference [deg] | 1.4 |
| Transmittance [%] | 0.09 |

FIG. 8

Chip pattern 23

|  | Standard deviation |
|---|---|
| CD [nm] | 2.2 |
| Phase difference [deg] | 1.4 |
| Transmittance [%] | 0.08 |

FIG. 9

Chip pattern 24

|  | Standard deviation |
|---|---|
| CD [nm] | 2.1 |
| Phase difference [deg] | 1.3 |
| Transmittance [%] | 0.07 |

FIG. 10

Chip pattern 25

|  | Standard deviation |
|---|---|
| CD [nm] | 1.6 |
| Phase difference [deg] | 1.1 |
| Transmittance [%] | 0.05 |

FIG. 11

Chip pattern 26

|  | Standard deviation |
|---|---|
| CD [nm] | 2 |
| Phase difference [deg] | 1.2 |
| Transmittance [%] | 0.08 |

FIG. 12

Chip pattern 27

|  | Standard deviation |
|---|---|
| CD [nm] | 2.8 |
| Phase difference [deg] | 1.3 |
| Transmittance [%] | 0.09 |

Chip pattern 28

|                     | Standard deviation |
|---------------------|--------------------|
| CD [nm]             | 2.2                |
| Phase difference [deg] | 1.3             |
| Transmittance [%]   | 0.09               |

Chip pattern 29

|                     | Standard deviation |
|---------------------|--------------------|
| CD [nm]             | 2.2                |
| Phase difference [deg] | 1.4             |
| Transmittance [%]   | 0.09               |

| | Exposure latitude [%] |
|---|---|
| Entire surface | 7.1 |
| Chip pattern 21 | 6.8 |
| Chip pattern 22 | 6.5 |
| Chip pattern 23 | 6.7 |
| Chip pattern 24 | 6.6 |
| Chip pattern 25 | 6.1 |
| Chip pattern 26 | 6.5 |
| Chip pattern 27 | 6.8 |
| Chip pattern 28 | 6.6 |
| Chip pattern 29 | 6.7 |

PHOTOMASK QUALITY ESTIMATION SYSTEM AND METHOD FOR USE IN MANUFACTURING OF SEMICONDUCTOR DEVICE, AND METHOD FOR MANUFACTURING THE SEMICONDUCTOR DEVICE

CROSS-REFERENCE TO RELATED APPLICATIONS

This application is based upon and claims the benefit of priority from prior Japanese Patent Application No. 2005-188678, filed Jun. 28, 2005, the entire contents of which are incorporated herein by reference.

BACKGROUND OF THE INVENTION

1. Field of the Invention

The present invention relates to a technique for estimating the quality of a photomask used for manufacturing a semiconductor device, and more specifically to a photomask quality estimation system and method, and a method for manufacturing the semiconductor device.

2. Description of the Related Art

In accordance with the progress of microfabrication of semiconductor devices, there is a demand for further enhancement in the accuracy of lithography. To meet the demand, much stricter dimensional accuracy is now being required for the photomasks used for lithography. For instance, there is a demand for reducing the tolerance in mask planar dimensions to 10 nm or less, and more desirably, to 5 nm or less. Photomasks are manufactured by forming a resist pattern on a mask blank, and etching the shade film of the mask blank into a plurality of chip patterns. When, for example, a halftone phase-shift mask as a kind of photomask is produced, estimations concerning a number of check items, such as dimensional variation, phase difference, transmittance, and existence/non-existence of a defect, are performed to estimate the quality of the mask.

However, in the prior art, since all mask patterns included in the chip patterns of a photomask are regarded as a population for quality estimation, even if only some of the chip patterns are non-compliant and the other chip patterns are compliant, the photomask is considered defective. This makes the yield of photomasks extremely low, regardless of the progress in the accuracy of the photomask manufacturing technique (see, for example, Jpn. Pat. Appln. KOKAI Publication No. 2002-72440).

BRIEF SUMMARY OF THE INVENTION

In accordance with a first aspect of the invention, there is provided a photomask quality estimation system comprising: a measuring unit which measures a mask characteristic of each of a plurality of chip patterns formed on a mask substrate; a latitude computation unit which computes an exposure latitude of said each chip pattern based on the mask characteristic; and an estimation unit which estimates quality of said each chip pattern based on the exposure latitude.

In accordance with a second aspect of the invention, there is provided a photomask quality estimation method comprising: measuring a mask characteristic of each of a plurality of chip patterns formed on a mask substrate; computing an exposure latitude of said each chip pattern based on the mask characteristic; and estimating quality of said each chip pattern based on the exposure latitude.

In accordance with a third aspect of the invention, there is provided a method for manufacturing a semiconductor device, comprising: forming a plurality of chip patterns on a mask substrate; measuring a mask characteristic of each of a plurality of chip patterns formed on the mask substrate; computing an exposure latitude of said each chip pattern based on the mask characteristic; estimating quality of said each chip pattern based on the exposure latitude; projecting images of the chip patterns onto a resist film coated on a semiconductor substrate to form a resist pattern on the semiconductor substrate; and forming, on the semiconductor substrate, a plurality of circuit patterns corresponding to the chip patterns, using the resist pattern as a mask.

BRIEF DESCRIPTION OF THE SEVERAL VIEWS OF THE DRAWING

FIG. 3 is a plan view illustrating a photomask employed in the embodiment of the invention;

FIG. 5 is a table illustrating a first estimation master for the photomask;

FIG. 6 is a table illustrating a second estimation master for the photomask;

FIG. 7 is a table illustrating a third estimation master for the photomask;

FIG. 8 is a table illustrating a fourth estimation master for the photomask;

FIG. 9 is a table illustrating a fifth estimation master for the photomask;

FIG. 10 is a table illustrating a sixth estimation master for the photomask;

FIG. 11 is a table illustrating a seventh estimation master for the photomask;

FIG. 12 is a table illustrating an eighth estimation master for the photomask;

DETAILED DESCRIPTION OF THE INVENTION

Figure 1:
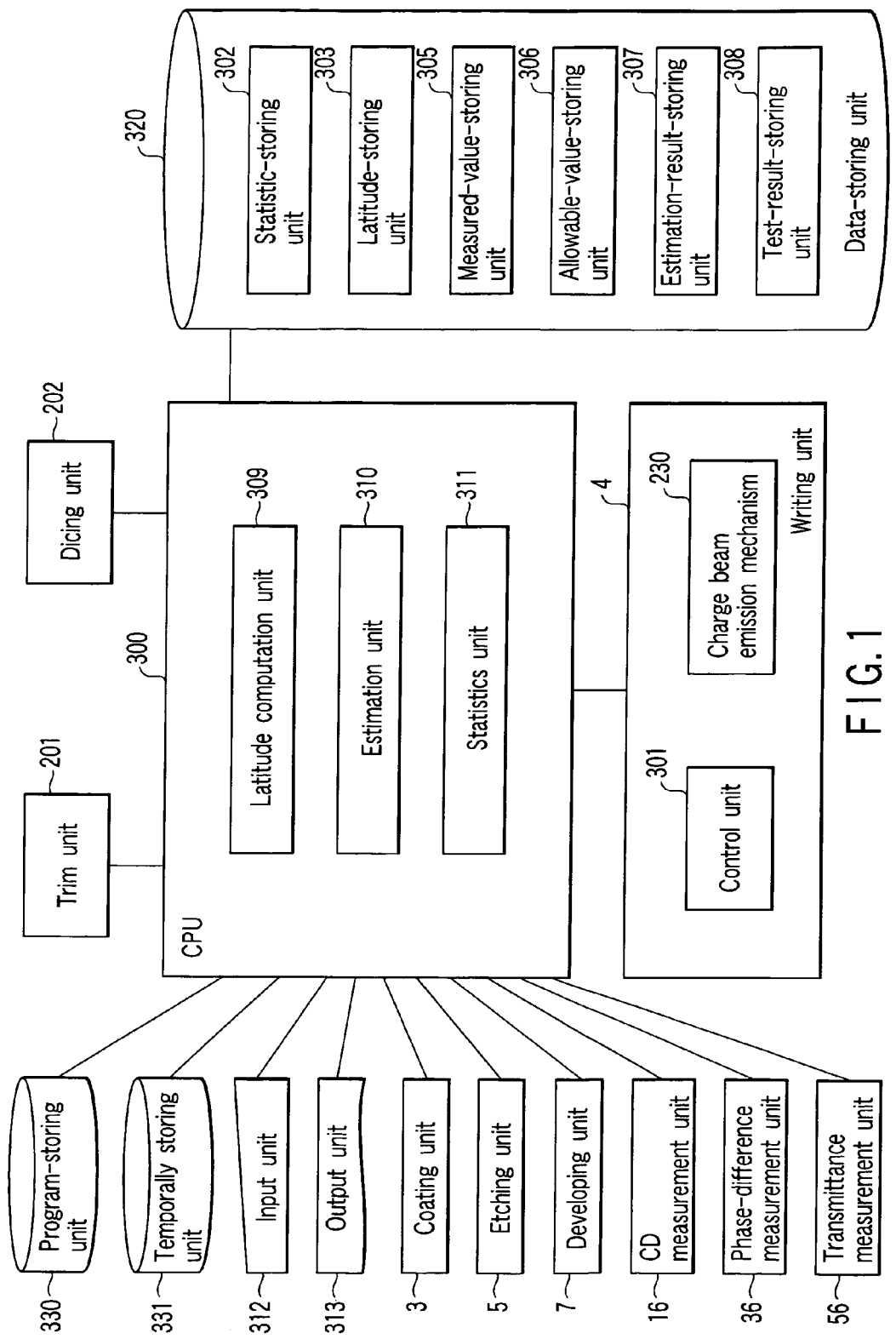
FIG. 1 is a block diagram illustrating a photomask quality estimation system according to an embodiment of the invention.

An embodiment of the invention will be described with reference to the accompanying drawings. In the drawings, like reference numbers denote like elements. The following embodiment just exemplifies the apparatus and methods for embodying the technical idea of the present invention, and the invention is not limited to the embodiment. Accordingly, various modifications may be made without departing from the spirit or scope of the technical idea.

As shown in FIG. 1, the photomask quality estimation system of the embodiment comprises a writing unit 4, CD (critical dimension) measurement unit 16, phase-difference measurement unit 36, transmittance measurement unit 56 and central processing unit (CPU) 300. The writing unit 4 writes a plurality of chip patterns on a mask substrate. The CD measurement unit 16 measures the mask characteristics of each of the chip patterns. The "mask characteristics" indicate each CD (critical dimension), phase difference and transmittance of the chip patterns, etc. The CPU 300 includes a latitude computation section 309 and estimation section 310. The latitude computation section 309 computes the exposure latitude of each of the chip patterns based on the mask characteristics. The estimation section 310 estimates the quality levels of the chip patterns based on the computed exposure latitude. The exposure latitude will be described later.

Figure 2:
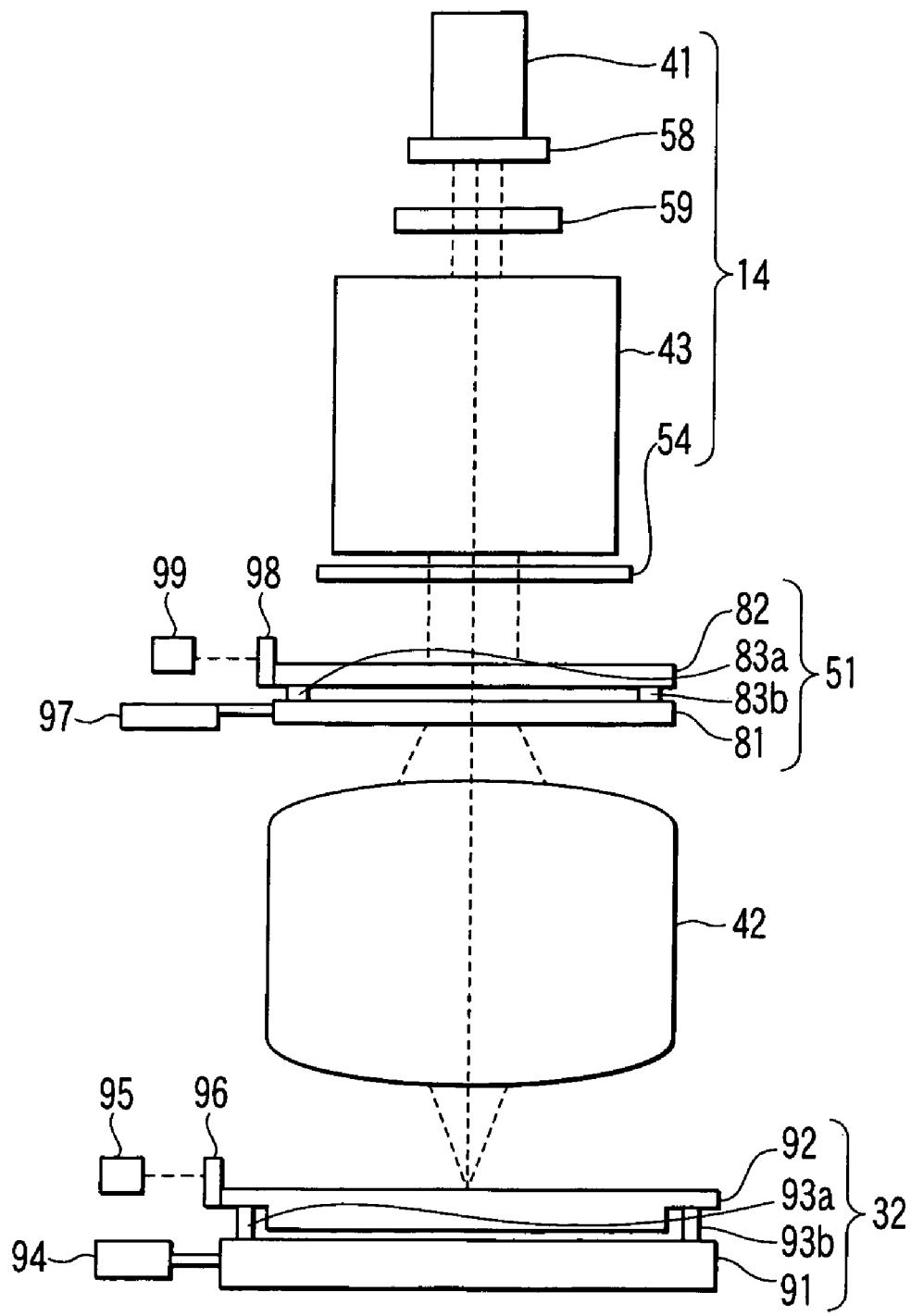
FIG. 2 is a schematic view illustrating an image reduction exposure unit employed in the photomask quality estimation system of the embodiment.

A photomask, whose quality is to be estimated by the photomask quality estimation system, is inserted into the exposure unit shown in FIG. 2. The exposure unit comprises an illumination optical system 14, reticle stage 51, optical projection system 42 and wafer system 32.

The illumination optical system 14 includes an illumination source 41, aperture stop holder 58, polarizer 59, optical convergence system 43 and slit holder 54. The illumination source 41 emits illumination light, such as an argon fluoride laser beam, having a wavelength of, for example, 193 nm. The aperture stop holder 58 is located below the illumination source 41. The polarizer 59 polarizes the illumination light emitted from the illumination source 41. The optical convergence system 43 converges the illumination light. The slit holder 54 is located below the optical convergence system 43. The reticle stage 51 is located below the slit holder 54. The optical projection system 42 is located below the reticle state 51. The wafer system 32 is located below the optical projection system 42.

The reticle stage 51 comprises a reticle XY stage 81, reticle movable shafts 83a and 83b placed on the reticle XY stage 81, and reticle Z-inclination stage 82 connected to the reticle XY stage 81 by the reticle movable shafts 83a and 83b. The reticle stage 51 is connected to a reticle-stage-driving unit 97. The reticle-stage-driving unit 97 horizontally scans the reticle XY stage 81, and vertically drives the reticle movable shafts 83a and 83b. Accordingly, the reticle Z-inclination stage 82 can be horizontally positioned by the reticle XY stage 81, and also can be inclined with respect to the horizontal direction by the reticle movable shafts 83a and 83b. A reticle movable mirror 98 is provided at an end of the reticle Z-inclination stage 82. The position of the reticle Z-inclination stage 82 is measured by a reticle laser interferometer 99 opposing the reticle movable mirror 98.

As shown in FIG. 3, a photomask having a plurality of chip patterns 21 to 29 is placed on the reticle stage 51. The chip patterns 21 to 29 are formed by etching a shade film 2 made of, for example, chrome (Cr), and hence include transmissive regions and shade regions. The transmissive regions are used to form a plurality of equivalent patterns on a wafer, such as a silicon (Si) wafer. Accordingly, the chip patterns 21 to 29 are identical in design. NAND devices, for example, are manufactured by projecting the chip patterns 21 to 29. In NAND devices, it is required to reduce the range of variations in characteristics and dimensions. Trimming described later, for example, can adjust the average characteristics of products.

A wafer coated with a resist film, onto which images of the chip patterns 21 to 29 shown in FIG. 3 are projected, is placed on the wafer stage 32 shown in FIG. 2. The resist film may be formed of a photosensitive material such as a positive or negative photoresist. The wafer stage 32 shown in FIG. 2 comprises a wafer XY stage 91, wafer movable shafts 93a and 93b placed on the wafer XY stage 91, and wafer Z-inclination stage 92 connected to the wafer XY stage 91 by the wafer movable shafts 93a and 93b. The wafer stage 32 is connected to a wafer-stage-driving unit 94. The wafer-stage-driving unit 94 horizontally scans the wafer XY stage 91, and vertically drives the wafer movable shafts 93a and 93b. Accordingly, the wafer Z-inclination stage 92 can be horizontally positioned by the wafer XY stage 91, and also can be inclined with respect to the horizontal direction by the wafer movable shafts 93a and 93b. A wafer movable mirror 96 is provided at an end of the wafer Z-inclination stage 92. The position of the wafer Z-inclination stage 92 is measured by a wafer laser interferometer 95 opposing the wafer movable mirror 96.

The photomask including the chip patterns 21 to 29 shown in FIG. 3 is produced by the coating unit 3, writing unit 4, developing unit 7 and etching unit 5. The coating unit 3 is, for example, a spin coating unit for coating a resist film on a mask substrate that is formed of, for example, quartz glass and has the shade film 2 deposited thereon. The writing unit 4 includes a charge beam emission mechanism 230 and control unit 301. The etching unit 5 etches the shade film using the mask resist pattern as an etching mask, thereby forming a plurality of chip patterns on the mask substrate. The mask resist film may be made of a photosensitive material, such as a positive or negative photoresist.

Figure 4:
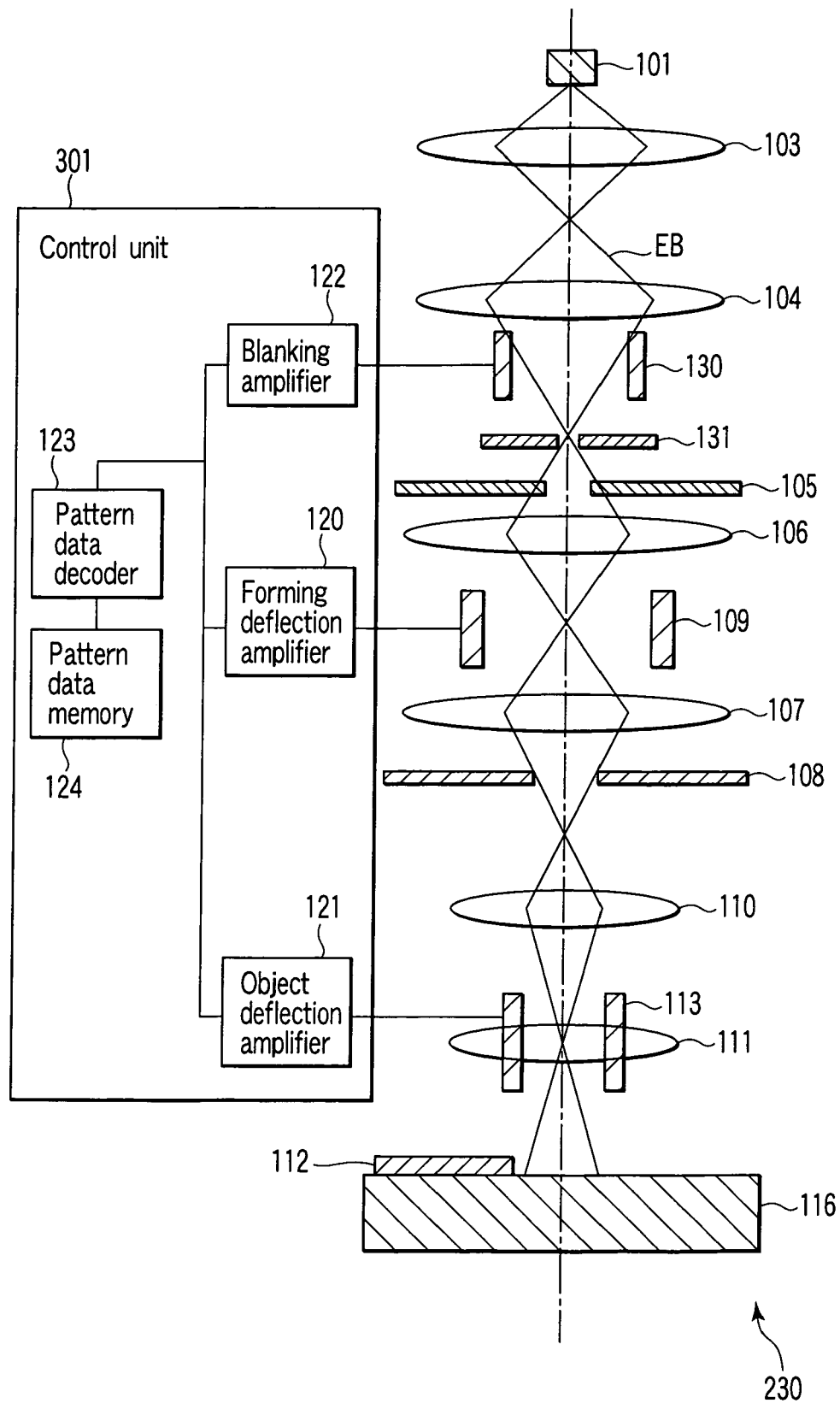
FIG. 4 is a schematic view illustrating a writing unit employed in the photomask quality estimation system of the embodiment.

As shown in FIG. 4, the charge beam emission mechanism 230 includes an electron gun 101 for emitting a charge beam. A first condenser lens 103 and second condenser lens 104 are provided below the electron gun 101. When a charge beam passes through the first condenser lens 103 and second condenser lens 104, the current density and Kohler illumination condition of the charge beam are adjusted. A first forming aperture plate 105 is provided below the second capacitor lens 104. The first forming aperture plate 105 controls the size of the charge beam. A first projector lens 106 and second projector lens 107 are provided below the first forming aperture plate 105. A second forming aperture plate 108 is provided below the second projector lens 107. The image formed by passing the charge beam through the first forming aperture plate 105 is guided to the second forming aperture plate 108. The second forming aperture plate 108 controls the size of the charge beam. A reduction lens 110 and object lens 111 are provided below the second forming aperture plate 108. A movable stage 116 for holding the mask substrate 112 is provided below the object lens 111.

The mask substrate 112 is coated with a mask resist film sensitive to the charge beam by the coating unit 3 shown in FIG. 1. The charge beam passing through the second forming aperture plate shown in FIG. 4 is reduced and projected onto the reverse surface of the mask resist film of the mask substrate 112 via the reduction lens 110 and object lens 111.

A blanking electrode 130 and blanking aperture plate 131 are interposed between the second condenser lens 104 and first forming aperture plate 105. To stop the emission of a charge beam onto the mask resist film on the mask substrate 112, the blanking electrode 130 deflects, onto the surface of the blanking aperture plate 131, the charge beam passing through the second condenser lens 104 to prevent the charge beam from reaching the mask resist film on the mask substrate 112. By stopping the emission of a charge beam onto the mask resist film on the mask substrate 112 using the blanking electrode 130 and blanking aperture plate 131, the period of emitting the charge beam to the mask resist film on the mask substrate 112 is adjusted to thereby adjust the emission amount of the charge beam on the mask resist film. A forming deflector 109 is interposed between the first and second projector lenses 106 and 107. The forming deflector 109 deflects the charge beam passing through the first projector lens 106 to control the emission position of the charge beam on the second forming aperture 108. An object deflector 113 is provided near the object lens 111. The object deflector 113 deflects the charge beam guided through the first and second forming aperture plates 105 and 108 to scan the surface of the mask resist film on the mask substrate 112.

The control unit 301 is connected to the charge beam emission mechanism 230. The control unit 301 comprises a blanking amplifier 122, forming deflection amplifier 120, object deflection amplifier 121, pattern data decoder 123 and pattern data memory 124. The blanking amplifier 122 applies a deflection voltage to the blanking electrode 130 to start and finish the emission of a charge beam onto the mask resist film on the mask substrate 112. This adjusts the amount of emission onto the mask resist film. The forming deflection amplifier 120 applies a deflection voltage to the forming deflector 109 to set the shape and size of the charge beam applied to the mask resist film on the mask substrate 112. The object deflection amplifier 121 applies a deflection voltage to the object deflector 113 to set the scanning position of the charge beam on the mask resist film on the mask substrate 112. The pattern data memory 124 stores the design data of the chip patterns 21 to 29 in the form of, for example, a CAD file. The pattern data decoder 123 shown in FIG. 4 reads the CAD file from the pattern data memory 124, and instructs the forming deflection amplifier 120 and object deflection amplifier 121 to write, on the mask resist film, a latent mask resist pattern corresponding to the chip patterns 21 to 29.

The developing unit 7 shown in FIG. 1 develops the mask resist film with the latent mask resist pattern written thereon, thereby forming a mask resist pattern on the shade film 2. The etching unit 5 etches the shade film 2, using the mask resist pattern as an etching mask, thereby forming, on the mask substrate 112, such chip patterns 21 to 29 as shown in FIG. 3. A dry etching unit, for example, is used as the etching unit 5.

A deep ultraviolet (DUV) microscope, for example, can be used as the CD measurement unit 16 shown in FIG. 1. The CD measurement unit 16 measures each CD of each chip pattern 21 to 29 shown in FIG. 3, which is regarded as one of the mask characteristics. An optical thin-film characteristic measurement unit, for example, can be used as the phase-difference measurement unit 36 shown in FIG. 1. The phase-difference measurement unit 36 measures the phase differences of the chip patterns 21 to 29, which is regarded as another mask characteristic. A vacuum ultraviolet spectroscope, for example, can be used as the transmittance measurement unit 56 shown in FIG. 1. The transmittance measurement unit 56 measures each transmittance of each chip pattern 21 to 29, which is regarded as yet another mask characteristic.

Figures 13, 14, 15:
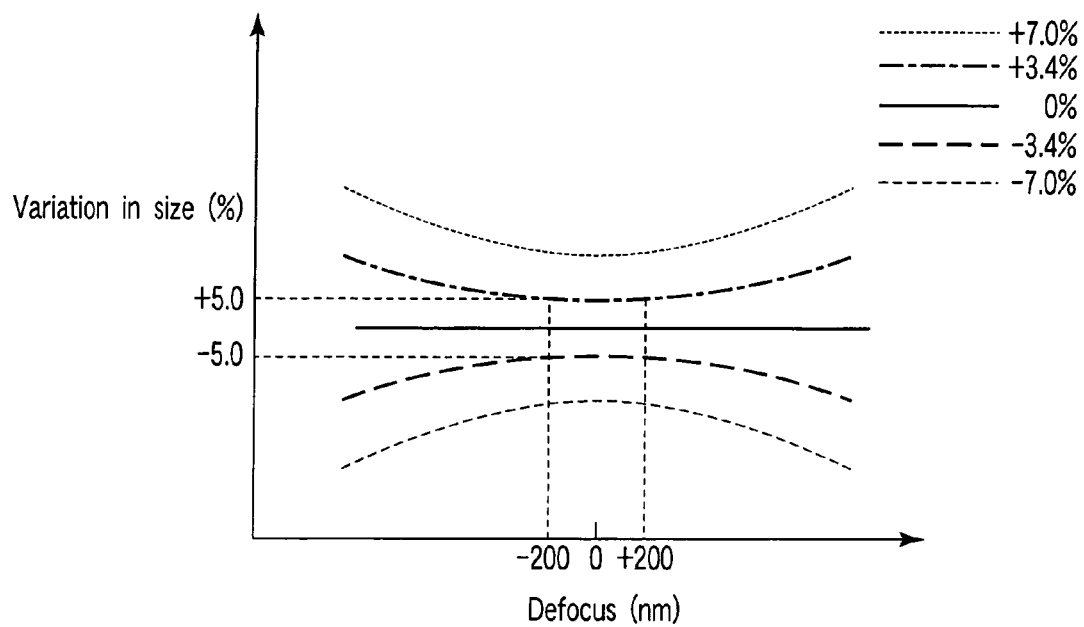
FIG. 13 is a table illustrating a ninth estimation master for the photomask.
FIG. 14 is a table illustrating a tenth estimation master for the photomask.
FIG. 15 is a graph useful in explaining the exposure latitude of the embodiment.

The statistics unit 311 of the CPU 300 shown in FIG. 1 estimates, from the actual measurement values of appropriately extracted samples, the standard deviations of the CDs, phase differences and transmittances acquired when all mask patterns included in the chip patterns 21 to 29 are regarded as a population. For instance, in the example of FIG. 5, the standard deviations of the CDs, phase differences and transmittances acquired when all mask patterns included in the chip patterns 21 to 29 are regarded as a population are 2.8, 1.8 and 0.11, respectively. Further, the statistics unit 311 of the CPU 300 shown in FIG. 1 estimates, from the actual measurement values of appropriately extracted samples, the standard deviations of the CDs, phase differences and transmittances acquired when all mask patterns included in each of the chip patterns 21 to 29 are regarded as a population. For instance, in the example of FIG. 6, the standard deviations of the CDs, phase differences and transmittances acquired when all mask patterns included in the chip pattern 21 are regarded as a population are 2.1, 1.5 and 0.09, respectively. Further, in the example of FIG. 7, the standard deviations of the CDs, phase differences and transmittances acquired when all mask patterns included in the chip pattern 22 are regarded as a population are 2.0, 1.4 and 0.09, respectively. Similarly, in the example of FIG. 8, the standard deviations of the CDs, phase differences and transmittances acquired when all mask patterns included in the chip pattern 23 are regarded as a population are 2.2, 1.4 and 0.08, respectively. In the example of FIG. 9, the standard deviations of the CDs, phase differences and transmittances acquired when all mask patterns included in the chip pattern 24 are regarded as a population are 2.1, 1.3 and 0.07, respectively. In the example of FIG. 10, the standard deviations of the CDs, phase differences and transmittances acquired when all mask patterns included in the chip pattern 25 are regarded as a population are 1.6, 1.1 and 0.05, respectively. In the example of FIG. 11, the standard deviations of the CDs, phase differences and transmittances acquired when all mask patterns included in the chip pattern 26 are regarded as a population are 2.0, 1.2 and 0.08, respectively. In the example of FIG. 12, the standard deviations of the CDs, phase differences and transmittances acquired when all mask patterns included in the chip pattern 27 are regarded as a population are 2.8, 1.3 and 0.09, respectively. In the example of FIG. 13, the standard deviations of the CDs, phase differences and transmittances acquired when all mask patterns included in the chip pattern 28 are regarded as a population are 2.2, 1.3 and 0.09, respectively. In the example of FIG. 14, the standard deviations of the CDs, phase differences and transmittances acquired when all mask patterns included in the chip pattern 29 are regarded as a population are 2.2, 1.4 and 0.09, respectively.

Based on the design data of the chip pattern 21 shown in FIG. 3, and the standard deviations computed from the measured CDs, phase differences and transmittances of the chip pattern 21, the latitude computation section 309 computes, by optical simulation, the exposure latitude to be acquired when the chip pattern 21 is projected on a resist film using the exposure unit of FIG. 2. FIG. 15 shows the relationship between the defocus points from the focus of the optical projection system 42 of FIG. 2 and the changes in the CD of the projection image of the chip pattern 21 shown in FIG. 3, acquired when the amount of exposure is varied from a reference value by −0.7%, −0.34%, 0%, +3.4% and +7.0%. It is understood from FIG. 15 that to secure a defocus margin of ±200 nm and a margin of ±5.0% concerning a change in the size of the projection image of the chip pattern 21, it is necessary to limit a change in exposure amount to the range of −3.4% to +3.4%, i.e., to less than 6.8%. The allowable range of changes in exposure amount set to secure a desired range of defocus points and a desired range of changes in the size of the projection image of the chip pattern is called "exposure latitude". The latitude computation section 309 also computes the exposure latitude of each of the chip patterns 22 to 29.

Figures 16, 17:
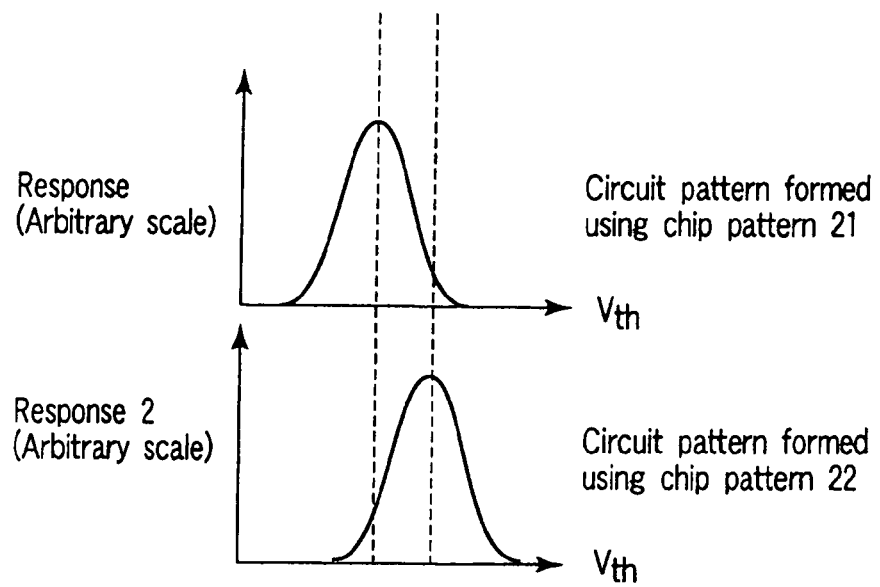
FIG. 16 is a table illustrating an exposure latitude master employed in the embodiment.
FIG. 17 is a first graph illustrating the electrical characteristic of circuit patterns employed in the embodiment.

The latitude computation section 309 further computes the exposure latitude of all chip patterns 21 to 29. In the example of FIG. 16, the exposure latitude of all chip patterns 21 to 29 shown in FIG. 3 is 7.1%, and the exposure latitude degrees of the chip patterns 21 to 29 are 6.8%, 6.5%, 6.7%, 6.6%, 6.5%, 6.8%, 6.6% and 6.7%, respectively.

The estimation section 310 shown in FIG. 1 estimates compares the exposure latitude of each of the chip patterns 21 to 29 with the upper limit set for the exposure latitude of the photomask shown in FIG. 3, thereby estimating the quality of the photomask. For instance, when the upper limit value of the exposure latitude is 7.0%, the estimation section 310 determines that the chip patterns 21 to 29 are acceptable in quality since their exposure latitude degrees are all less than 7.0%. If the exposure latitude of a certain one of the chip patterns 21 to 29 is not less than 7.0%, the estimation section 310 determines that the certain chip pattern is unacceptable in quality.

A trim unit 201 connected to the CPU 300 measures the electrical characteristic of circuit patterns formed on a wafer by projecting, onto the resist film of the wafer, the images of the chip patterns 21 to 29 shown in FIG. 3, using the exposure unit shown in FIG. 2. More specifically, the trim unit 201 has a tester function for bringing a probe card into contact with the pads of the wafer to supply test waves to circuit patterns formed on the wafer, and measure the electrical characteristic output therefrom. If different electrical characteristic values are acquired from different circuit patterns, the trim unit 201 performs a trimming process to make the circuit patterns have the same electrical characteristic.

Figure 18:
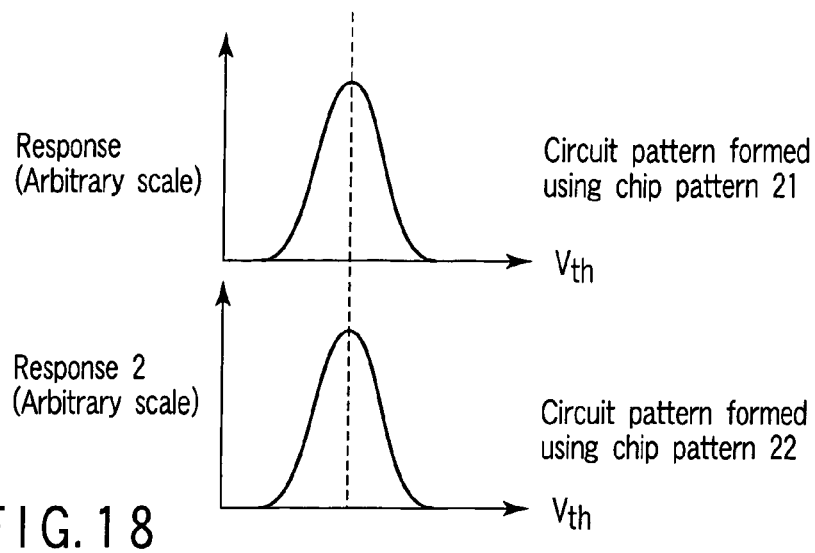
FIG. 18 is a second graph illustrating the electrical characteristic of circuit patterns employed in the embodiment.

If the measured CD of the chip pattern 21 is greater than that of the chip pattern 22, the CD of the circuit pattern acquired by projecting the chip pattern 21 is greater than that of the circuit pattern acquired by projecting the chip pattern 22. Further, if the measured transmittance of the chip pattern 21 is greater than that of the chip pattern 22, the CD of the circuit pattern acquired by projecting the chip pattern 21 is greater than that of the circuit pattern acquired by projecting the chip pattern 22, since the amount of exposure at the resist film of the wafer is greater in the circuit pattern corresponding to the chip pattern 21 than in the circuit pattern corresponding to the chip pattern 22. Accordingly, the circuit pattern corresponding to the chip pattern 21 has a lower electric resistance than the circuit pattern corresponding to the chip pattern 22. As a result, a response can be acquired from the circuit pattern corresponding to the chip pattern 21 when a lower voltage is applied thereto, than from the circuit pattern corresponding to the chip pattern 22, as is shown in FIG. 17. Accordingly, based on the mask characteristics, such as the CDs and transmittances, etc., of the chip patterns 21 to 29, the trim unit 201 estimates a change (hereinafter referred to as a "trimming value") in electrical characteristic (e.g., electric resistance) acquired when fuses included in the circuit patterns formed on the wafer are melted and blown. Further, based on the differences in electrical characteristic between the circuit patterns, and the estimated trimming values of the fuses, the trim unit 201 computes the number of fuses that should be melted and blown. The trim unit 201 makes the electrical characteristic values of the circuit patterns on the wafer identical to each other by melting and blowing, using a laser or current, the computed number of fuses in each of the circuit patterns, as is shown in FIG. 18. Note that when wiring is formed by, for example, a damascene process, the CD of a mask pattern does not correspond to that of the wiring formed on a wafer, therefore the trimming process performed by the trim unit 201 is not limited to the above-described one.

The CPU 300 shown in FIG. 1 is connected to a dicing unit 202. The dicing unit 202 cuts a wafer in a lattice of uniform squares, using a blade. The CPU 300 is also connected to a data-storing unit 320. The data-storing unit 320 comprises a measured-value-storing unit 305, statistic-storing unit 302, latitude-storing unit 303, allowable-value-storing unit 306, estimation-result-storing unit 307 and test-result-storing unit 308.

The measured-value-storing unit 305 stores data concerning the CDs, phase differences and transmittances of the chip patterns 21 to 29 measured by the CD measurement unit 16, phase-difference measurement unit 36 and transmittance measurement unit 56. The statistic-storing unit 302 shown in FIG. 1 stores the statistics masks shown in FIGS. 6 to 14, which record the standard deviations of the CDs, phase differences and transmittances of the chip patterns 21 to 29 computed by the statistics unit 311. The latitude-storing unit 303 shown in FIG. 1 stores the exposure latitude master which records the exposure latitude degrees of the chip patterns 21 to 29 shown in FIG. 16 and computed by the latitude computation unit 309. The allowable-value-storing unit 306 shown in FIG. 1 stores an exposure latitude upper limit value used by the estimation unit 310 to estimate the chip patterns 21 to 29. The estimation-result-storing unit 307 shown in FIG. 1 stores quality estimation results concerning the chip patterns 21 to 29, acquired by the estimation unit 310. The test-result-storing unit 308 shown in FIG. 1 stores the test results concerning the electrical characteristic of the circuit patterns, acquired by the trim unit 201.

The CPU 300 is further connected to an input unit 312, output unit 313, program-storing unit 330 and temporarily storing unit 331. The input unit 312 may be formed of, for example, a pointing device, such as a keyboard or mouse. The output unit 313 may be formed of an image display unit, such as a liquid crystal display or monitor, and a printer, etc. The program-storing unit 330 stores, for example, an operating system for controlling the CPU 300. The temporarily storing unit 331 sequentially stores the operational results of the CPU 300. Recording mediums for storing programs, such as semiconductor memories, magnetic disks, optical disks, magnetooptical disks, or magnetic tapes, are used as the program-storing unit 330 and temporarily storing unit 331.

Figure 19:
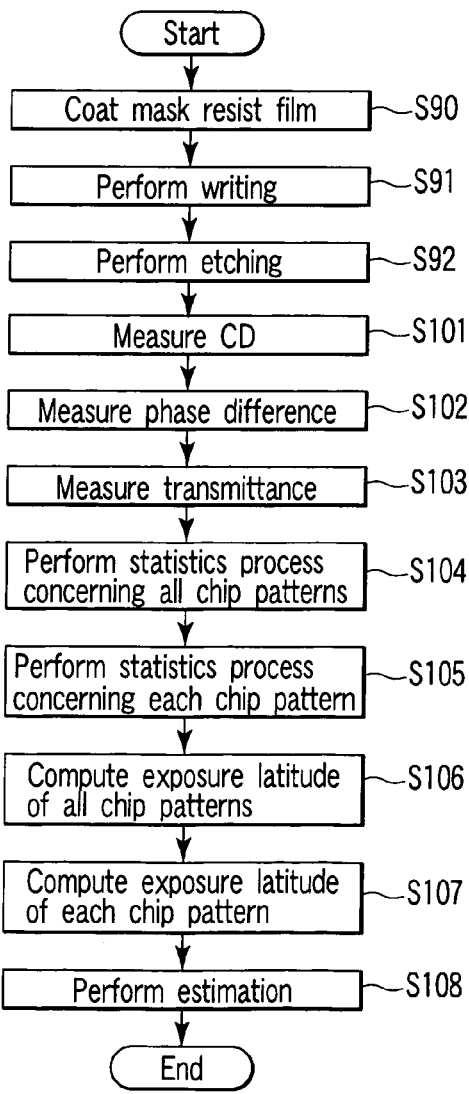
FIG. 19 is a flowchart illustrating a photomask quality estimation method employed in the embodiment.

Referring now to the flowchart of FIG. 19, a photomask quality estimation method employed in the embodiment will be described.

(a) At step S90, a mask substrate 112 with a shade film deposited thereon is prepared, and the shade film is coated with a mask resist film using the coating unit shown in FIG. 1. At step S91, the mask substrate 112 is placed on the movable stage 116 of the charge beam emission mechanism 230 shown in FIG. 4. Subsequently, the pattern data decoder 123 reads, from the pattern data memory 124, design data of the chip patterns 21 to 29 shown in FIG. 3, and instructs the blanking amplifier 122, forming deflection amplifier 120 and object deflection amplifier 121 shown in FIG. 4 to write chip patterns on the mask resist film. The blanking amplifier 122, forming deflection amplifier 120 and object deflection amplifier 121 apply deflection voltages to the blanking electrode 130, forming deflector 109 and object deflector 113, respectively, to deflect the charge beam emitted from the electron gun 101, thereby writing, on the mask resist film, latent images corresponding to the chip patterns 21 to 29.

(b) At step S92, after the mask resist film is baked, it is developed by the developing unit 7 using an alkali developer, thereby forming a mask resist pattern corresponding to the chip patterns 21 to 29. Subsequently, the mask substrate 112 is moved into the etching unit 5 shown in FIG. 1. The etching unit 5 eliminates, by reactive ion etching, parts of the shade film using the mask resist pattern as an etching mask, thereby forming the chip patterns 21 to 29 on the mask substrate 112.

Thus, a photomask is completed. After that, the mask resist film is separated by ashing, and the mask substrate 112 is cleaned.

(c) At step S101, the CD measurement unit 16 shown in FIG. 1 measures the CDs of the chip patterns 21 to 29 shown in FIG. 3, and stores them in the measured-value-storing unit 305 shown in FIG. 1. At step S102, the phase-difference measurement unit 36 measures the phase differences between the chip patterns 21 to 29, and stores them in the measured-value-storing unit 305. At step S103, the transmittance measurement unit 56 measures the transmittances of the chip patterns 21 to 29, and stores them in the measured-value-storing unit 305. At step S104, the statistics unit 311 reads, from the measured-value-storing unit 305, all the measured CDs, phase differences and transmittances of the chip patterns 21 to 29. After that, the statistics unit 311 computes the standard deviations of the CDs, phase differences and transmittances, and stores them in a statistics master prepared for the entire surface of the photomask shown in FIG. 5.

(d) At step S105, the statistics unit 311 reads, from the measured-value-storing unit 305, the measured CDs, phase differences and transmittances of the chip pattern 21. Thereafter, the statistics unit 311 computes the standard deviations of the CDs, phase differences and transmittances of the chip pattern 21, and stores them in a statistics master prepared for the chip pattern 21 shown in FIG. 6. The statistic unit 311 also computes the standard deviations of the CDs, phase differences and transmittances of the other chip patterns 22 to 29, and stores them in respective statistics masters prepared for the chip patterns 22 to 29 shown in FIGS. 7 to 14.

(e) At step S106, the latitude computation section 309 computes the exposure latitude of the entire surface of the photomask, based on the design data of the chip patterns 21 to 29 and the standard deviations of the CDs, phase differences and transmittances recorded in the statistic master for the entire surface of the photomask shown in FIG. 5. The latitude computation section 309 stores the computed exposure latitude of the entire photomask surface in the exposure latitude master shown in FIG. 16. At step S107, the latitude computation section 309 further computes the respective exposure latitudes of the chip patterns 21 to 29, based on the design data of the chip patterns 21 to 29 and the standard deviations of the CDs, phase differences and transmittances recorded in the statistic masters for the chip patterns 21 to 29 shown in FIGS. 6 to 14. The latitude computation section 309 stores the computed exposure latitudes of the chip patterns 21 to 29 in the exposure latitude master shown in FIG. 16.

(f) At step S108, the estimation unit 310 shown in FIG. 1 reads the upper exposure latitude limit from the allowable-value-storing unit 306. Assume here that the upper limit is 7.0%. Subsequently, the estimation unit 310 reads, from the exposure latitude master of FIG. 16, the exposure latitude of the entire photomask surface and the exposure latitudes of the chip patterns 21 to 29. The estimation unit 310 compares the exposure latitudes of the entire photomask surface and chip patterns 21 to 29 with the respective upper limit values. If the exposure latitude exceeds the upper limit, it is determined "unacceptable", whereas if the former is lower than the latter, it is determined "acceptable". Since in the example of FIG. 16, the exposure latitude of the entire photomask surface is 7.1%, it is determined "unacceptable". However, the exposure latitudes of the chip patterns 21 to 29 are 6.8%, 6.5%, 6.7%, 6.6%, 6.1%, 6.5%, 6.8%, 6.6% and 6.7%, therefore are all determined "acceptable". Accordingly, the estimation unit 310 estimates that the photomask is "usable", and stores, in the estimation-result-storing unit 307, the determination results concerning the exposure latitude and the estimation results concerning the photomask. This is the termination of the photomask quality estimation method of the embodiment.

The photomask quality estimation system and method described with reference to FIGS. 1 to 19 can improve the yield of photomask products. In the prior art, to estimate the quality of a photomask, all mask patterns included in the chip patterns 21 to 29 shown in FIG. 3 provided on the photomask are used as a population for exposure latitude computation. Accordingly, where the upper limit of the exposure latitude is 7.0%, if the exposure latitude of the entire photomask surface exceeds 7.0%, the photomask is determined unusable. In contrast, at step S107 of the photomask quality estimation method shown in FIG. 19, the exposure latitude of each of the chip patterns 21 to 29 is computed, and at step S108, it is determined whether each computed exposure latitude does not exceed the upper limit. Therefore, the photomask shown in FIG. 16, which is determined "unusable" in the prior art, is determined "usable" in this embodiment, since the exposure latitude of each chip pattern 21 to 29 does not exceed the upper limit. Namely, the photomask quality estimation system and method described with reference to FIGS. 1 to 19 improve the yield of photomask products.

Figure 20:
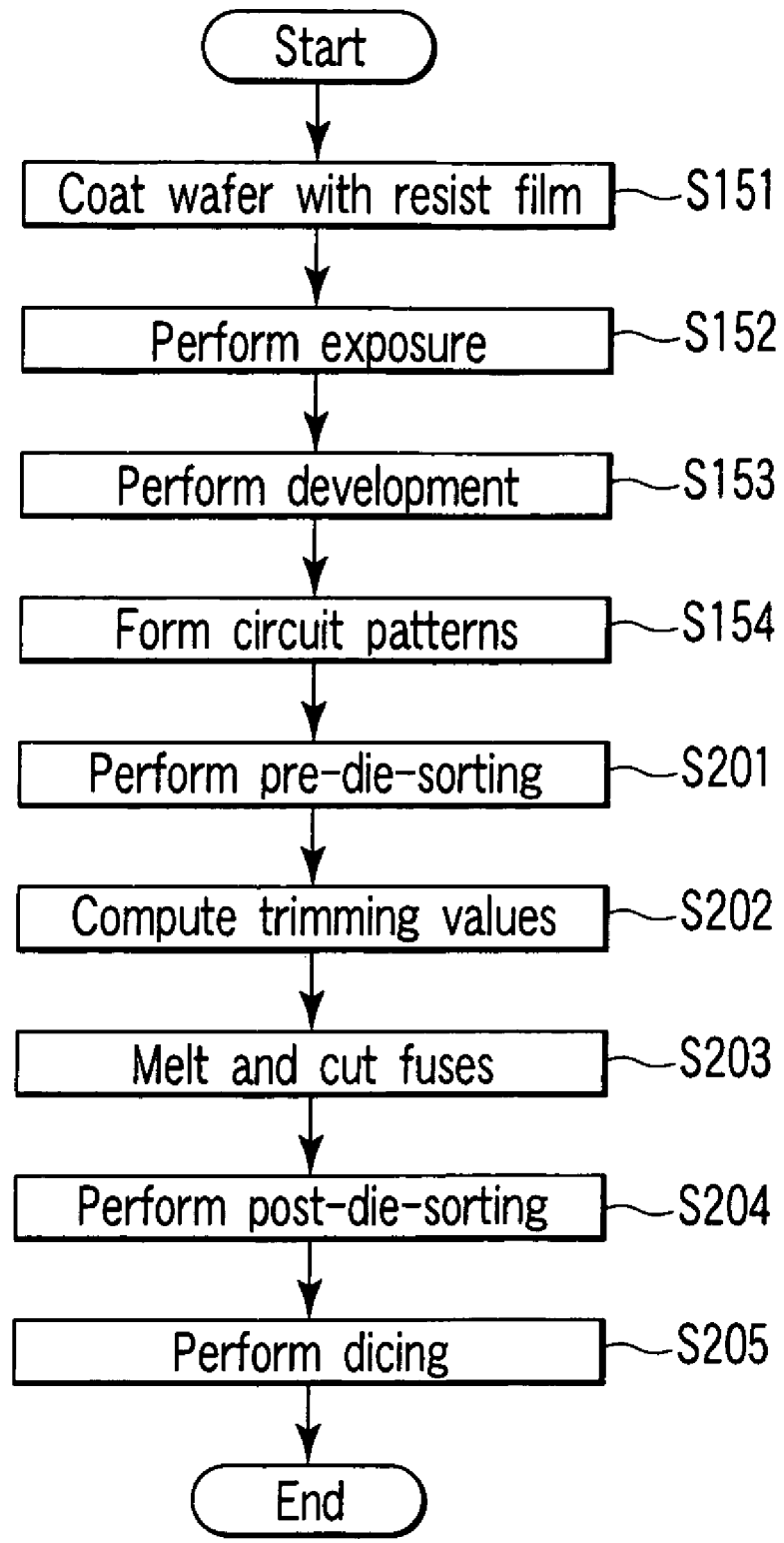
FIG. 20 is a flowchart illustrating a method of manufacturing a semiconductor device employed in the embodiment.

Referring then to the flowchart of FIG. 20, a description will be given of a method for manufacturing a semiconductor device using the photomask quality estimation method of the embodiment.

(A) At step S151, a wafer is coated with a resist film using the coating unit 3. The wafer is then placed onto the wafer stage 32 of the exposure unit shown in FIG. 2. At step S152, the photomask estimated "usable" by the estimation unit 310 of FIG. 1 is placed onto the reticle stage 51 of the exposure unit. After that, the illumination source 41 emits illumination light to project images of the chip patterns 21 to 29 of FIG. 3 onto the resist film of the wafer. At step S153, the resist film of the wafer is exposed to light, baked (PEB) and developed, thereby forming, on the wafer, a resist pattern corresponding to the chip patterns 21 to 29. At step S154, using the resist pattern as a process mask, a conductive layer and insulation layer are deposited on the wafer, thereby forming a plurality of circuit patterns on the wafer.

(B) At step S201, the circuit patterns formed on the wafer are subjected to pre-die-sorting. Specifically, the probe card of the trim unit 201 shown in FIG. 1 is brought into contact with the pads included in the circuit patterns to apply a wave signal thereto, and stores, in the test-result-storing unit 308, the electrical characteristic of the circuit patterns output therefrom. At step S202, the trim unit 201 reads the electrical characteristic of the circuit patterns from the test-result-storing unit 308, and determines whether the read electrical characteristic is uniform. If the electrical characteristic is not uniform, the trimming values of the fuses included in the circuit patterns are computed to eliminate the differences in electrical characteristic between the chip patterns 21 to 29, based on the measured CDs, phase differences and transmittances of the chip patterns 21 to 29 stored in the measured-value-storing unit 305.

(C) At step S203, based on the computed trimming values, the trim unit 201 melts and cuts part of the fuses included in the circuit patterns, using a laser or current, thereby unifying the circuit patterns in electrical characteristic. At step S204, the trim unit 201 performs post-die-sorting to confirm whether trimming is performed correctly. Specifically, the trim unit 201 brings the probe card into contact with the pads included in the circuit patterns, and confirms whether the electrical characteristic of the circuit patterns output in response to the input wave signal is uniform. If it is confirmed that trimming has been performed correctly, the wafer is subjected at step S205 to dicing performed by the dicing unit 202, thereby producing a plurality of semiconductor chips having circuit patterns of an identical electrical characteristic. After that, the semiconductor chips are sealed in respective packages, which is the completion of a plurality of semiconductor devices.

In the prior art, when a plurality of circuit patterns are subjected to trimming, the number of fuses to be melted and cut is determined based on the trimming values computed from the designed values, without regarding variations in such values that occur during the process. However, the chip patterns 21 to 29 differ in mask characteristic as shown in FIGS. 6 to 14, therefore different trimming values are acquired. This being so, there is a case where even if the fuses determined from the trimming values that are computed from the designed values are melted and cut, differences in characteristic between the circuit patterns are not eliminated. In contrast, in the semiconductor device manufacturing method of the embodiment shown in FIG. 20, trimming values are computed based on the mask characteristic of each of the chip patterns 21 to 29, and hence a change in the electrical characteristic due to fuse cutting can be accurately estimated. Accordingly, the number of fuses to be melted and cut can be accurately estimated, which enables the uniformity in electrical characteristic between a plurality of circuit patterns to be realized highly accurately.

As described above in detail, the embodiment of the invention can provide a photomask quality estimation system and method, and a semiconductor-device-manufacturing method, which can accurately estimate the quality of photomasks and hence enhance the yield of photomask products.

Other Embodiments

The present invention is not limited to the above-described embodiment. Any one skilled in the art can realize various embodiments based on the techniques taught by of the present invention, and can utilize the techniques in various ways. For instance, the above-described photomask quality estimation method can be realized as temporally successive processes or operations. Accordingly, the photomask quality estimation system shown in FIG. 1 can execute the photomask quality estimation method shown in FIG. 19, using a computer program that instructs, for example, the processors included in the CPU 300 to execute a plurality of functions. A memory device, magnetic disk device, optical disk device and other devices that can record programs can be used as memory mediums. As described above, the present invention can include other various embodiments. Namely, the technical scope of the present invention is defined only by the structural elements specified in the appended claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask quality estimation system comprising:
a measuring unit which measures a mask characteristic of each of a plurality of chip patterns formed on a mask substrate, the plurality of chip patterns including identical chip patterns for forming a device;
a latitude computation unit which computes an exposure latitude of said each chip pattern based on the mask characteristic; and
an estimation unit which estimates quality of said each chip pattern based on the exposure latitude,
wherein the estimation unit compares the exposure latitude of each said chip pattern with an upper limit set for the exposure latitude of the entire mask substrate, and determines whether the exposure latitude of each said chip pattern is equal to or less than the upper limit, each said chip pattern satisfying the determination being usable to form a resist pattern on a wafer.

2. The photomask quality estimation system according to claim 1, further comprising:
a statistics unit which estimates a standard deviation of values of the mask characteristic obtained when patterns included in the chip patterns are used as a population, based on actually measured values of the mask characteristic of samples extracted from the population,
and wherein the latitude computation unit computes the exposure latitude based on the standard deviation.

3. The photomask quality estimation system according to claim 2, further comprising:
a statistic-storing unit which stores a statistics master recording the standard deviation;
a latitude-storing unit which stores an exposure latitude master recording the exposure latitude of said each chip pattern; and
an allowable-value-storing unit which stores an upper limit set for the exposure latitude and used when the estimation unit estimates the quality of said each chip pattern.

4. The photomask quality estimation system according to claim 1, wherein the estimation unit determines that the quality of said each chip pattern is acceptable when the exposure latitude of said each chip pattern is equal to or less than the upper limit, and determines that the quality of said each chip pattern is unacceptable when the exposure latitude of said each chip pattern is more than the upper limit.

5. The photomask quality estimation system according to claim 4, wherein:
the measuring unit measures a mask characteristic of all the chip patterns;
the latitude computation unit computes an exposure latitude of all the chip patterns based on the mask characteristic of all the chip pattern; and
the estimation unit estimates quality of all the chip patterns based on the exposure latitude of all the chip patterns.

6. The photomask quality estimation system according to claim 1, wherein the mask characteristic includes at least one of a CD (critical dimension) of said each chip pattern, a phase difference of said each chip pattern, and a transmittance of said each chip pattern.

7. The photomask quality estimation system according to claim 6, further comprising:
a CD (critical dimension) measurement unit which measures the CD of said each chip pattern,
a phase-difference measurement unit which measures the phase difference of said each chip pattern; and
a transmittance measurement unit which measures the transmittance of said each chip pattern.

8. A photomask quality estimation method comprising:
measuring a mask characteristic of each of a plurality of chip patterns formed on a mask substrate, the plurality of chip patterns including identical chip patterns for forming a device;
computing an exposure latitude of said each chip pattern based on the mask characteristic;

estimating quality of said each chip pattern based on the exposure latitude, wherein the estimating the quality includes comparing the exposure latitude of said each chip pattern with an upper limit set for the exposure latitude of the entire mask substrate, and determining whether the exposure latitude of said each chip pattern is equal to or less than the upper limit, and forming a resist pattern on a wafer of said each chip pattern that satisfies the determination using the mask substrate.

9. The photomask quality estimation method according to claim 8, further comprising:

estimating, after measuring the mask characteristic, a standard deviation of values of the mask characteristic obtained when mask patterns included in said each chip pattern are used as a population, based on actually measured values of the mask characteristic of samples extracted from the population, and wherein the exposure latitude is computed based on the standard deviation.

10. The photomask quality estimation method according to claim 9, further comprising:

storing a statistics master recording the standard deviation;

storing an exposure latitude master recording the exposure latitude of said each chip pattern; and storing an upper limit set for the exposure latitude and used when the estimation unit estimates said each chip pattern.

11. The photomask quality estimation method according to claim 8, wherein the determining whether the exposure latitude of said each chip pattern is equal to or less than the upper limit determines that the quality of said each chip pattern is acceptable when the exposure latitude of said each chip pattern is equal to or less than the upper limit, and determines that the quality of said each chip pattern is unacceptable when the exposure latitude of said each chip pattern is more than the upper limit.

12. The photomask quality estimation method according to claim 11, further comprising:

measuring a mask characteristic of all the chip patterns;

computing an exposure latitude of all the chip patterns based on the mask characteristic of all the chip pattern; and estimating quality of all the chip patterns based on the exposure latitude of all the chip patterns.

13. The photomask quality estimation method according to claim 8, wherein the mask characteristic includes at least one of a CD (critical dimension) of said each chip pattern, a phase difference of said each chip pattern, and a transmittance of said each chip pattern.

* * * * *